(12) United States Patent
Li et al.

(10) Patent No.: US 12,231,093 B2
(45) Date of Patent: Feb. 18, 2025

(54) METHOD, DEVICE, AND SYSTEM FOR SIGNAL DISTORTION PRE-CORRECTION, AND COMPOSITE SYSTEM

(71) Applicant: ZTE Corporation, Shenzhen (CN)

(72) Inventors: Yunhua Li, Shenzhen (CN); Zheyuan Zhang, Shenzhen (CN); Wenhao Du, Shenzhen (CN); Dongfang Ning, Shenzhen (CN); Zuofeng Zhang, Shenzhen (CN); Zhengjian Dai, Shenzhen (CN)

(73) Assignee: ZTE CORPORATION, Shenzhen (CN)

( * ) Notice: Subject to any disclaimer, the term of this patent is extended or adjusted under 35 U.S.C. 154(b) by 665 days.

(21) Appl. No.: 17/607,303

(22) PCT Filed: Dec. 31, 2019

(86) PCT No.: PCT/CN2019/130264
§ 371 (c)(1),
(2) Date: Oct. 28, 2021

(87) PCT Pub. No.: WO2020/220715
PCT Pub. Date: Nov. 5, 2020

(65) Prior Publication Data
US 2022/0224290 A1    Jul. 14, 2022

(30) Foreign Application Priority Data

Apr. 30, 2019  (CN) .......................... 201910365031.X

(51) Int. Cl.
*H03F 1/38*    (2006.01)
*H03F 1/02*    (2006.01)
(Continued)

(52) U.S. Cl.
CPC ............. *H03F 1/32* (2013.01); *H03F 1/0205* (2013.01); *H03F 3/21* (2013.01); *H03F 1/3247* (2013.01);
(Continued)

(58) Field of Classification Search
CPC . H03F 1/32; H03F 1/0205; H03F 3/21; H03F 2201/3215; H03F 3/245;
(Continued)

(56) References Cited

U.S. PATENT DOCUMENTS 6,587,514 B1 *  7/2003  Wright ................. H03F 1/3247
                                                  330/149
6,943,627 B2 *  9/2005  Leyonhjelm .......... H03F 1/3247
                                                  327/590
(Continued)

FOREIGN PATENT DOCUMENTS

CN    102281221 A    12/2011
CN    102594749 A    7/2012
(Continued)

OTHER PUBLICATIONS

European Patent Office. Extended European Search Report for EP Application No. 19927206.3, mailed Apr. 25, 2022, pp. 1-13.
(Continued)

*Primary Examiner* — Khanh V Nguyen
(74) *Attorney, Agent, or Firm* — Vivacqua Crane, PLLC

(57) ABSTRACT

A device, method, and system for signal distortion pre-correction, and a composite system are disclosed. The device-includes: a signal distortion correction network module, a correction parameter trainer, a data collection module connected to an external power amplifier module, and a first conversion module. The data collection module is configured to perform time-division collection on output signals of channels of the power amplifier module and output analog feedback signals to the first conversion module. The first conversion module is configured to convert the analog feedback signals into digital feedback signals. The correction parameter trainer is configured to determine a correction parameter according to the digital feedback signals and a forward signal inputted. The signal distortion correction
(Continued)

network module is configured to correct the forward signal based on the correction parameter and output a pre-corrected signal.

17 Claims, 6 Drawing Sheets

(51) Int. Cl.
    *H03F 1/26*     (2006.01)
    *H03F 1/32*     (2006.01)
    *H03F 3/21*     (2006.01)
    *H03F 1/34*     (2006.01)

(52) U.S. Cl.
    CPC ........ *H03F 1/34* (2013.01); *H03F 2201/3215* (2013.01)

(58) Field of Classification Search
    CPC . H03F 3/68; H03F 1/3247; H03F 3/19; H03F 1/3241; H03F 1/26; H03F 1/3229; H04B 7/0617; H04B 7/0413
    USPC ..... 330/149; 375/296, 297; 455/63.1, 114.2, 455/114.3
    See application file for complete search history.

(56) References Cited

U.S. PATENT DOCUMENTS

| | | | |
|---|---|---|---|
| 8,351,543 B2* | 1/2013 | Kenington | ................ H03F 3/24 375/267 |
| 10,623,049 B2* | 4/2020 | Zhang | ...................... H03F 3/68 |
| 2011/0235749 A1* | 9/2011 | Kenington | ........ H04L 25/03343 375/296 |
| 2012/0119810 A1 | 5/2012 | Bai | |
| 2015/0103952 A1* | 4/2015 | Wang | ................... H04B 1/0475 375/297 |
| 2017/0279470 A1 | 9/2017 | Lee et al. | |

FOREIGN PATENT DOCUMENTS

| | | |
|---|---|---|
| CN | 109150240 B | 7/2020 |
| EP | 3255799 A1 | 12/2017 |
| WO | 2012126431 A2 | 9/2012 |
| WO | 2018098629 A1 | 6/2018 |
| WO | 2019000168 A1 | 1/2019 |

OTHER PUBLICATIONS

Liu et al. "Beam-Oriented Digital Predistortion for 5G Massive MIMO Hybrid Beamforming Transmitters," IEEE Transactions on Microwave Theory and Techniques, vol. 66, No. 7, Jul. 2018, pp. 3419-3432.

Sulimarski, et al. "Polynomial Memory Pre Distortion for 5G Wireless Systems with Multiple Power Amplifiers," 2018 Texas Symposium on Wireless and Microwave Circuits and Systems (WMCS), 2018, pp. 1-5.

Japan Patent Office. Notice of Reasons for Refusal for JP Application No. 2021-562395 and English translation, mailed Dec. 6, 2022, pp. 1-10.

International Searching Authority. International Search Report and Written Opinion for PCT Application No. PCT/CN2019/130264, and English translation, mailed Mar. 26, 2021, pp. 1-10.

* cited by examiner

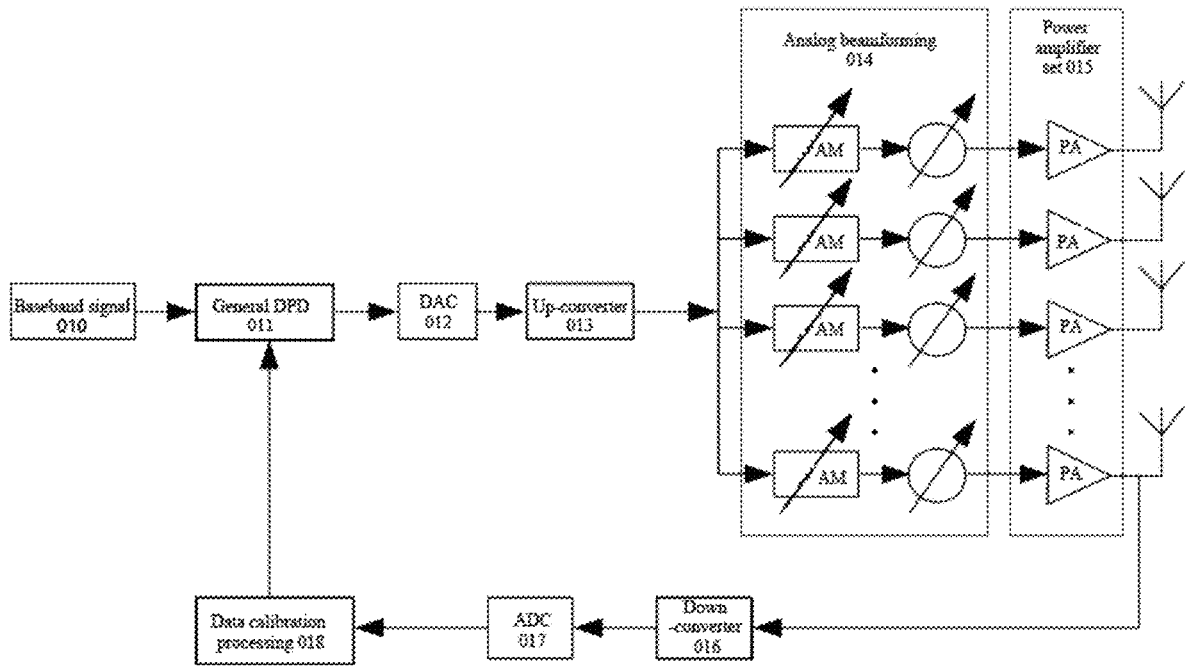
FIG. 1 --Prior Art--
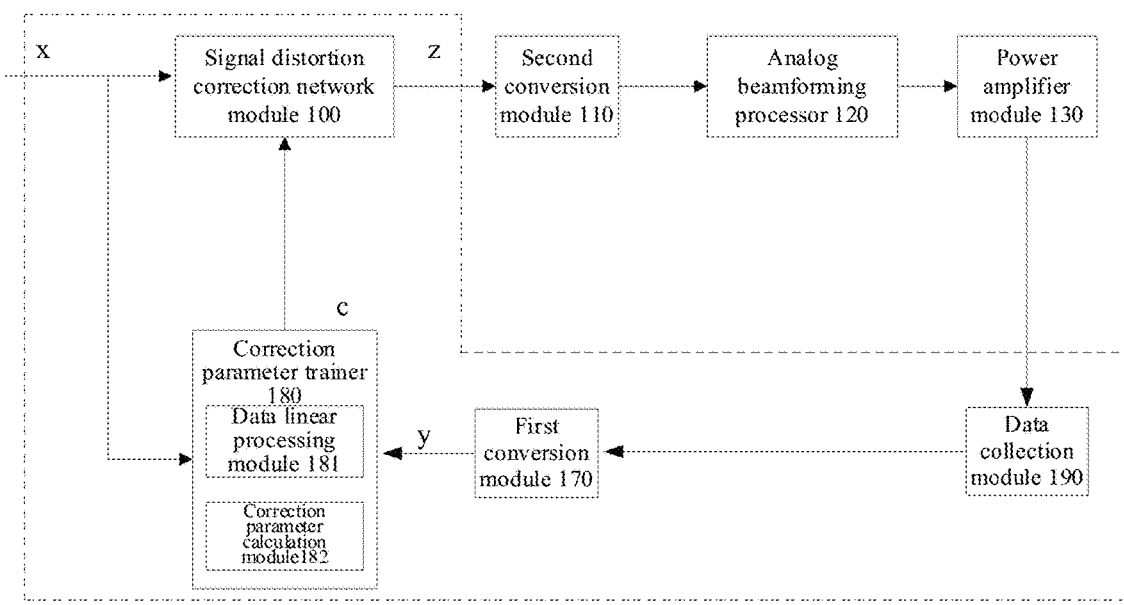
FIG. 2

METHOD, DEVICE, AND SYSTEM FOR SIGNAL DISTORTION PRE-CORRECTION, AND COMPOSITE SYSTEM

CROSS-REFERENCE TO RELATED APPLICATIONS

This application is a national stage filing under 35 U.S.C. § 371 of international application number PCT/CN2019/130264, filed Dec. 31, 2019, which claims priority to Chinese patent application No. 201910365031.X filed Apr. 30, 2019. The contents of these applications are incorporated herein by reference in their entirety.

TECHNICAL FIELD

Embodiments of the present disclosure relate to, but not limited to, the technical field of communications, and in particular to a method, device, and system for signal distortion pre-correction, and a composite system.

BACKGROUND

In modern mobile communication systems, multi-carrier transmission technologies and high-order digital modulation modes will lead to a higher peak-to-average ratio and a larger signal transmission bandwidth of the system. When a power amplifier (PA) operates near the saturated region, the PA will have serious nonlinear distortion and memory effects in this case. One effective method to avoid the nonlinear distortion of the PA is to back off the power of the input signal, but the efficiency of the PA will be greatly reduced and the power consumption will be increased. At present, the digital pre-distortion technology has become the first choice for distortion pre-correction in the nonlinear systems due to its low cost and obvious distortion improvement effect.

In the $5^{th}$ generation (5G) millimeter wave communication, in order to realize larger system capacity, higher spectrum utilization and higher beamforming gain, the massive multiple in multiple out (Massive MIMO) technology and the analogy beamforming technology are used. However, the use of the analogy beamforming technology will lead to the connection of one digital channel to a plurality of analog RF channels. In this case, if the digital pre-distortion technology is used, it is necessary to design a pre-distorter to simultaneously correct the nonlinear distortion of a plurality of PAs. Moreover, in the system, since there is no circulator between the PA and the antenna element, the output load mismatch and the inter-antenna coupling interference will greatly affect the characteristics of the power amplifier, thereby bringing a greater challenge to the design of the pre-distorter. Conventional pre-distortion algorithms are more suitable for the scenario where one digital channel corresponds to one analog RF channel. If a conventional pre-distortion method is used in the multiple in multiple out (MIMO) analog beamforming system, the structural complexity and volume of the transmitter will be greatly increased, and the power consumption will also be increased.

SUMMARY

In one aspect, embodiments of the present disclosure provide a device for signal distortion pre-correction, including: a signal distortion correction network module, a correction parameter trainer, a data collection module and a first conversion module, the data collection module being connected to an external power amplifier module. The data collection module is configured to perform time-division collection on output signals of a plurality of channels of the power amplifier module and output a plurality of analog feedback signals to the first conversion module; the first conversion module is configured to convert the plurality of analog feedback signals into a plurality of digital feedback signals and transmit them to the correction parameter trainer; the correction parameter trainer is configured to determine a correction parameter according to the plurality of digital feedback signals and a forward signal inputted and output the correction parameter to the signal distortion correction network module; and the signal distortion correction network module is configured to correct the forward signal based on the correction parameter and output a pre-corrected signal.

In another aspect, embodiments of the present disclosure provide a method for signal distortion pre-correction, including: performing time-division collection on output signals of a plurality of channels of a power amplifier module to obtain a plurality of analog feedback signals; converting the plurality of analog feedback signals into a plurality of digital feedback signals; determining a correction parameter according to the plurality of digital feedback signals and a forward signal inputted; and correcting the forward signal based on the correction parameter to obtain a pre-corrected signal.

In yet another aspect, embodiments of the present disclosure provide a system for signal distortion pre-correction, including the device for signal distortion pre-correction provided in the embodiments of the present disclosure, a second conversion module, an analog beamforming processor and the power amplifier module. The device for signal distortion pre-correction is further configured to output the pre-corrected signal to the second conversion module; the second conversion module is configured to convert the pre-corrected signal into an analog signal and output the analog signal to the analog beamforming processor; the analog beamforming processor is configured to weight an amplitude and phase of the inputted analog signal to generate a weighted analog signal and output the weighted analog signal to the power amplifier module; and the power amplifier module is configured to amplify and output the weighted analog signal.

In yet another aspect, embodiments of the present disclosure provide a composite system for signal distortion pre-correction, including a plurality of the systems for signal distortion pre-correction provided in the embodiments of the present disclosure. The plurality of systems for signal distortion pre-correction multiplex a same correction parameter trainer, the correction parameter trainer is connected to related modules in the plurality of systems for signal distortion pre-correction through at least one selection switch.

BRIEF DESCRIPTION OF DRAWINGS

The accompanying drawings are provided for further understanding of the technical schemes of the present disclosure and constitute a part of this specification. The accompanying drawings are used with the embodiments of the present disclosure to explain, rather than limit the technical schemes of the present disclosure.

FIG. 1 is an architecture diagram of a conventional device for signal distortion pre-correction suitable for an MIMO millimeter wave communication system;

FIG. 2 is an architecture diagram of a device for signal distortion pre-correction according to an embodiment of the present disclosure;

DETAILED DESCRIPTION

Figure 3:
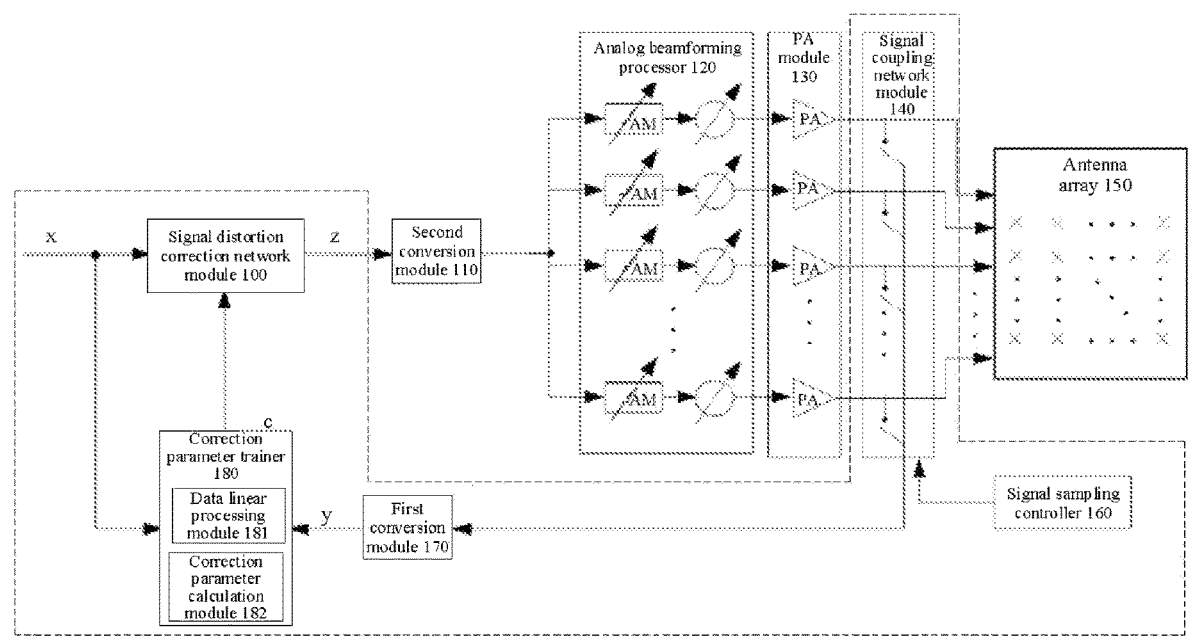
FIG. 3 is another architecture diagram of the device for signal distortion pre-correction according to an embodiment of the present disclosure.

In order to make the objectives, technical schemes and advantages of the present disclosure clearer, the embodiments of the present disclosure will be described in detail below with reference to the accompanying drawings. It is to be noted that the embodiments in the present disclosure and the features in the embodiments may be arbitrarily combined with each other to derive other embodiments not explicitly described.

The steps shown in the flowcharts in the accompanying drawings may be executed in a computer system, for example, a set of computer-executable instructions. Moreover, although a logical order is shown in the flowcharts, in some cases, the steps shown or described may be executed in a different order than presented herein.

Some schemes have been proposed for the distortion pre-correction of the MIMO analog beamforming systems. Although these schemes can pre-correct the nonlinear signal distortion in the multi-antenna analog beamforming systems to a certain extent, they still have great deficiencies.

In some cases, only one feedback link channel is used to perform collection feedback, data preprocessing and model parameter extraction on an output signal of one power amplifier, and also used to correct an overall nonlinear distortion of all power amplifiers, which have high requirements for the consistency of characteristics of all power amplifiers. FIG. 1 is an architecture diagram of a conventional device for signal distortion pre-correction suitable for an MIMO millimeter wave communication system. The device includes: a baseband signal 010, a general PDP (digital pre-distortion) (module) 011, a DAC (digital to analog converter) (module) 012, an up-converter (module) 013, an analog beamforming (module) 014, a power amplifier set 015, a down-converter (module) 016, an ADC (analog to digital converter) (module) 017 and a data calibration (module) 018. The device performs feedback collection and data calibration on the output of only one power amplifier, and extracts DPD parameters based on the general DPD architecture, so as to correct and compensate the nonlinear distortion of all power amplifiers.

In other cases, there is a need to perform de-beamforming and combination on the feedback collection signals of a plurality of power amplifiers in an analog domain, which brings about high requirement for the consistency of the characteristics of the power amplifiers and the consistency of transmission links between output ports of the power amplifiers and a combiner. Meanwhile, the output signals of all power amplifiers in the analog domain need to be classified. However, if the classification criterion is selected inappropriately, the performance of a signal distortion pre-calculation algorithm will be greatly affected. In addition, there is a need to adjust a power supply voltage or current of each power amplifier in real time using a power amplifier control module, which is disadvantageous to stabilize the characteristics of the power amplifiers and increases the system complexity.

In addition, in the above two cases, the influences on the signal distortion pre-correction performance from factors such as output load mismatch and antenna coupling interference are not taken into consideration.

The embodiments of the present disclosure provide a method and device for signal distortion pre-correction suitable for an MIMO millimeter wave communication system. By performing time-division collection on the output signals of power amplifiers, linearly processing multiple paths of data in parallel, establishing a correction model, constructing and weighting signal matrices, extracting a correction parameter, and finally updating the correction parameter in a distortion correction network in real time, the purpose of pre-correcting the nonlinear system distortion can be achieved.

An embodiment of the present disclosure provides a device for signal distortion pre-correction. FIG. 2 shows an architecture diagram of the device for signal distortion pre-correction according to the embodiment of the present disclosure. The device includes: a signal distortion correction network module 100, a first conversion module 170, a correction parameter trainer 180 and a data collection module 190. The device is connected to a second conversion module 110, an analog beamforming processor 120, a power amplifier module 130 and an antenna array module (not shown in FIG. 2) which are arranged externally. The antenna array module includes a plurality of antenna elements. The data collection module 190 is connected to the power amplifier module 130, the signal distortion correction network module 100 is connected to the second conversion module 110, and the second conversion module 110 is connected to the analog beamforming processor 120. The power amplifier module 130 includes a plurality of channels (analog channels) each having, for example, one power amplifier.

The data collection module 190 is configured to perform time-division collection on output signals of the plurality of channels of the power amplifier module 130 and output analog feedback signals to the first conversion module 170.

The conversion module 170 is configured to convert the analog feedback signals into digital feedback signals and transmit them to the correction parameter trainer 180. The first conversion module 170 is, for example, an analog-to-digital conversion module. In addition, the first conversion module 170 may have a frequency conversion function, for example, it may be an ADC integrated with a frequency conversion function.

The correction parameter trainer 180 is configured to determine a correction parameter according to the digital feedback signals and a forward signal inputted and output the correction parameter to the signal distortion correction network module 100. The correction parameter trainer 180 can perform data linear processing on the forward signal and the digital feedback signals, and solve and iteratively train parameters of a signal distortion pre-correction model.

The signal distortion pre-compensation model may be multiple groups of low-order filters, a Volterra series, a memory cross polynomial, a neural network (e.g., a BP network, an ART network, etc.), a wavelet network, a support vector machine, etc.

The signal distortion correction network module 100 is configured to correct (or perform distortion pre-compensation on) the forward signal inputted based on the correction parameter and output a pre-corrected signal to the second conversion module 110.

The device for signal distortion pre-correction according to the embodiment of the present disclosure can collect the signals of the plurality of channels in a time-division manner, and perform correction based on the feedback signals of the plurality of channels, so that the requirements for the consistency of the characteristics of the power amplifiers in the channels are reduced.

In an embodiment, as shown in FIG. 3 which is another architecture diagram of the device for signal distortion pre-correction according to the embodiment of the present disclosure, the data collection module 190 may include a signal coupling network module 140 and a signal sampling controller 160. The signal coupling network module 140 is connected to the external power amplifier module 130.

The signal sampling controller 160 may be configured to control the signal coupling network module 140 to realize the time-division collection on the output signals of the plurality of channels of the power amplifier module 130. In an embodiment, the signal coupling network module 140 is controlled to connect an output of a certain channel of the power amplifier module 130 to the feedback link, so as to acquire an output signal of the channel. It is to be noted that the plurality of channels undergoing time-division collection may be all or some channels of the power amplifier module 130.

The signal coupling network module 140 may be configured to perform time-division coupling to the output signals of the channels of the power amplifier module 130 according to the control of the signal sampling controller 160 and output analog feedback signals to the first conversion module 170. The output signals of the channels may be the output signals of the power amplifiers of the power amplifier module.

In an embodiment, the correction parameter trainer 180 may include a data linear processing module 181 and a correction parameter calculation module 182.

The data linear processing module 181 may be configured to linearly process the forward signal and the digital feedback signals to obtain a linearly processed forward signal and linearly processed digital feedback signals. The linear processing includes, but not limited to, at least one of time delay alignment, mirror calibration, frequency point alignment, feedback ripple compensation and complex gain compensation. In an embodiment, the linear processing is parallel linear processing.

The correction parameter calculation module 182 may be configured to construct a plurality of signal matrices based on the preset signal distortion pre-correction module, the linearly processed forward signal, the linearly processed digital feedback signals and the pre-corrected signal, the signal matrices corresponding to the collected channels; weight the plurality of signal matrices by using weighting factors and generate a combined matrix using the weighted signal matrices; acquire a nonlinear distortion pre-compensation parameter based on the combined matrix; and determine a link imbalance calibration parameter based on the linearly processed forward signal and the linearly processed digital feedback signals, the weighting factor of a signal matrix being positively correlated with performance of a channel corresponding to the signal matrix. In an embodiment, the weighting factor is an adjacent channel power ratio (ACPR) of the channel corresponding to the signal matrix. It is to be noted that the weighting factor is not limited to the ACPR and may be obtained in other ways.

In the device for signal distortion pre-correction according to the embodiment of the present disclosure, during extraction of the correction parameter, by weighting the constructed signal matrices, a performance index in the beamforming direction can be optimized; and, by linearly processing the feedback signals of the power amplifiers in parallel, the influences on the performance of the distortion correction algorithm from the delay, phase and amplitude differences between coupling feedback links can be eliminated. Since the feedback signal of each power amplifier can be linearly processed, the beam is at an arbitrary angle during the extraction of the correction parameter and is not limited to 0° beam, and the distortion pre-correction performance in a far-field beam direction can be ensured.

In an embodiment, the correction parameter calculation module 182 may be configured to determine a mismatch filter coefficient and a mutual coupling filter coefficient according to a power amplifier model of the power amplifier module, the linearly processed forward signal and the linearly processed digital feedback signals; construct a plurality of signal matrices based on the preset signal distortion pre-correction model, the mismatch filter coefficient, the mutual coupling filter coefficient, the linearly processed forward signal, the linearly processed digital feedback signals and the pre-corrected signal, the signal matrices corresponding to the collected channels; weight the plurality of signal matrices by using weighting factors, and generate a combined matrix using the weighted signal matrices; acquire a nonlinear distortion pre-compensation parameter, a mismatch compensation parameter and a mutual coupling compensation parameter based on the combined matrix; and determine a link imbalance calibration parameter based on the linearly processed forward signal and the linearly processed digital feedback signals, the weighting factor of a signal matrix being positively correlated with the performance of a channel corresponding to the signal matrix. The mismatch filter coefficient, the mutual coupling filter coefficient, the mismatch compensation parameter and the mutual coupling compensation parameter can be used to correct the distortion caused by load mismatch and the distortion caused by inter-antenna mutual coupling interference, so that the influences on the system performance from the output load mismatch and the inter-antenna mutual coupling interference can be reduced.

It is to be noted that, in another embodiment, the mismatch filter coefficient, the mutual coupling filter coefficient, the mismatch compensation parameter and the mutual coupling compensation parameter may also not be calculated.

In an embodiment, a signal matrix corresponding to a $j^{th}$ channel may be:

$$W_j = \begin{bmatrix} x_j(n) \cdot f_{00}^n & x_j(n) \cdot f_{01}^n & \ldots & x_j(n-L) \cdot f_{LQ}^N \\ x_j(n+1) \cdot f_{00}^{n+1} & x_j(n+1) \cdot f_{01}^{n+1} & \ldots & x_j(n+1-L) \cdot f_{LQ}^{n+1} \\ \vdots & \vdots & \ddots & \vdots \\ x_j(n+N) \cdot f_{00}^N & x_j(n+N) \cdot f_{00}^N & \ldots & x_j(n+N-L) \cdot f_{LQ}^N \end{bmatrix},$$

$$V_j = \begin{bmatrix} x_j(n) + z_j(n) - y'_j(n) \\ x_j(n+1) + z_j(n+1) - y'_j(n+1) \\ \vdots \\ x_j(n+N) + z_j(n+N) - y'_j(n+N) \end{bmatrix};$$

where $$f_{lk}^n = \sum_{p=0}^{k} [h_a * x_j(n-l) + h_b * x_j(n-l)]^p \cdot |x_j(n-l)|^{k-p},$$

$x_j$ is the linearly processed forward signal, $z_j$ is the pre-corrected signal, $y'_j$ is the linearly processed digital feedback signal, $h_a$ is the mismatch filter coefficient, $h_b$ is the mutual coupling filter coefficient, L and Q are memory depth and nonlinear order of the signal distortion pre-correction model, respectively, and N+1 is a data length used to construct the signal matrix.

In an embodiment, the weighting the plurality of signal matrices by using weighting factors and generating a combined matrix by using the weighted signal matrices includes:

$$W = [a_1 W_1, a_2 W_2, \ldots, a_K W_K]$$

$$V = [a_1 V_1^T, a_2 V_2^T, \ldots, a_K V_K^T],$$

where $a_1, a_2, \ldots, a_K$ are weighting factors.

Figure 4:
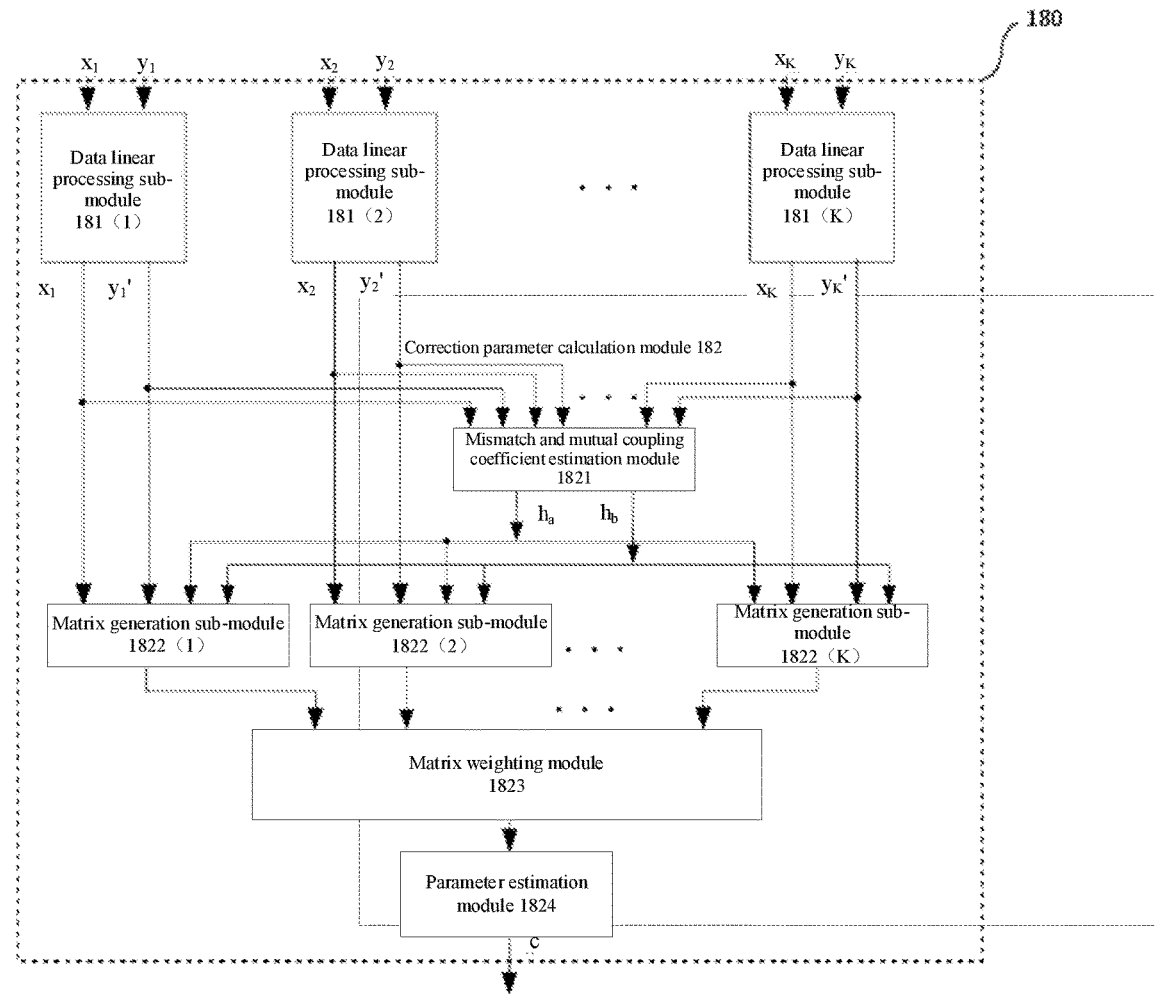
FIG. 4 is a basic structural diagram of a correction parameter trainer according to an embodiment of the present disclosure.

FIG. 4 is a basic structural diagram of a correction parameter trainer 180 according to an embodiment of the present disclosure. The correction parameter trainer 180 may include a data linear processing module (not shown in FIG. 4) and a correction parameter calculation module 182. The data linear processing module may include a plurality of parallel data linear processing sub-modules 181(1), 181(2), ..., 181(K). The correction parameter calculation module 182 may include a mismatch and mutual coupling coefficient estimation module 1821, a matrix generation module (not shown in FIG. 4), a matrix weighting module 1823 and a parameter estimation module 1824. The matrix generation module may include a plurality of matrix generation sub-modules 1822(1), 1822(2), ..., 1822(K).

The data linear processing sub-modules 181(1), 181(2), ..., 181(K) perform linear processing (for example, delay alignment, mirror calibration, complex gain compensation, frequency point alignment, feedback link ripple balancing, etc.) on the feedback signals $y_j$ output from the power amplifiers in parallel based on the forward signal $x_j$ (j=1, 2, ..., K), so as to obtain the linearly processed feedback signals. The mathematical expression of the output signal of each power amplifier is:

$$y_i(t) = G[x_i(t)] \cdot x_i(t-\tau_i) \cdot e^{j\{\Phi[x_i(t)]\omega_i t\}},$$

where $y_i(t)$ and $x_i(t)$ are an analog input signal and an output signal of an $i^{th}$ power amplifier, respectively; $G[x_i(t)]$ and $\Phi[x_i(t)]$ are an amplitude distortion and a phase distortion of the $i^{th}$ power amplifier, respectively; and, $\omega_i$ and $\tau_i$ are a frequency deviation and a transmission delay of an $i^{th}$ analog channel, respectively. Since a transmission delay, an amplitude value and a phase value of each of the feedback signals after being transmitted through links are different and may have a large difference, the difference between transmission links can be eliminated by linearly processing the feedback signals, so that it is advantageous for the subsequent extraction and training of the correction model parameter.

The mismatch and mutual coupling coefficient estimation module 1821 may be configured to estimate the mismatch filer coefficient and the mutual coupling filter coefficient. The mismatch filer coefficient is a coefficient used during filtering of the mismatch filter module, and the mutual coupling filter coefficient is a coefficient used during filtering of the mutual coupling filter module.

When the influences from the output load mismatch of the power amplifiers and the inter-antenna coupling interference are taken into consideration, a relation between the forward signal and the feedback signals is expressed as:

$$y'_j = f(x_j, x'_j, x''_j),$$

$$x'_j = h_a * x_j, x''_j = h_b * x_j;$$

where j=1, 2, ..., K; f(·) is a function describing the characteristics of the power amplifier; * is a linear convolution operator; $x'_j$ is a standing wave signal fitted based on the forward signal; $x''_j$ is an inter-antenna mutual coupling interference signal fitted based on the forward signal; $h_a$ is the mismatch filter coefficient; and, $h_b$ is the mutual coupling filter coefficient.

The linearly processed forward signal and feedback signal ($x_j$ and $y'_j$) are selected according to a specific power amplifier model (the power amplifier model may be selected according to the characteristics of the power amplifiers in the power amplifier module, for example, a memory cross polynomial model may be used; of course, this is only an example, and other power amplifier models may be selected as required), and then the model coefficient, the mismatch filter coefficient and the mutual coupling filter coefficient are crossly estimated by means of a least square (LS) algorithm, until the coefficients $h_a$ and $h_b$ satisfying the requirements are obtained. Then, other multiple groups of linearly processed data are selected and subjected to the above same operations to obtain multiple groups of mismatch filter coefficients and mutual coupling filter coefficients which are averaged to obtain a final mismatch filter coefficient and a mutual coupling filter coefficient.

The matrix generation module may be configured to construct signal matrices $W_1, W_2, \ldots, W_K$ and $V_1, V_2, \ldots, V_K$ in parallel according to the signal distortion pre-correction model by using the forward signal $x_j$ (j=1, 2, ..., K), the feedback signal $y'_j$ (j=1, 2, ..., K), the pre-corrected signal $z_j$ (i=1, 2, ..., K), the mismatch filter coefficient $h_a$ and the mutual coupling filter coefficient $h_b$. In an embodiment, the matrix generation module includes a plurality of matrix generation sub-modules 1822(1), 1822(2), ..., 1822(K). The matrix generation sub-module 1822(1) constructs signal matrices $W_1$ and $V_2$, the matrix generation sub-module 1822(2) constructs signal matrices $W_2$ and $V_2$, and the matrix generation sub-module 1822(K) constructs signal matrices $W_K$ and $V_K$, where the specific forms of the matrices $W_j$ and $V_j$ depend on the used signal distortion pre-compensation model. If the memory polynomial model is used, the matrices $W_j$ and $V_j$ are:

$$W_j = \begin{bmatrix} x_j(n) \cdot f_{00}^n & x_j(n) \cdot f_{01}^n & \cdots & x_j(n-L) \cdot f_{LQ}^n \\ x_j(n+1) \cdot f_{00}^{n+1} & x_j(n+1) \cdot f_{01}^{n+1} & \cdots & x_j(n+1-L) \cdot f_{LQ}^{n+1} \\ \vdots & \vdots & \ddots & \vdots \\ x_j(n+N) \cdot f_{00}^N & x_j(n+N) \cdot f_{00}^N & \cdots & x_j(n+N-L) \cdot f_{LQ}^N \end{bmatrix},$$

$$V_j = \begin{bmatrix} x_j(n) + z_j(n) - y'_j(n) \\ x_j(n+1) + z_j(n+1) - y'_j(n+1) \\ \vdots \\ x_j(n+N) + z_j(n+N) - y'_j(n+N) \end{bmatrix};$$

where $$f_{lk}^n = \sum_{p=0}^{k}[h_a * x_j(n-l) + h_b * x_j(n-l)]^p \cdot |x_j(n-l)|^{k-p},$$

L and Q are the memory depth and nonlinear order of the signal distortion pre-compensation model, respectively, and N+1 is the data length used to construct the plurality of signal matrices.

It is to be noted that the construction of $W_i$ and $V_j$ is only an example, and other construction methods may be used as required.

In another embodiment, when the nonlinear distortion caused by load imbalance and mutual coupling is not compensated, $$f_{lk}^n = \sum_{p=0}^{k}|x_j(n-l)|^{k-p}.$$

The matrix weighting module 1823 may be configured to weight the matrices $W_1, W_2, \ldots, W_K$ and $V_1, V_2, \ldots, V_K$ by using weighting factors $a_1, a_2, \ldots, a_K$ and generate combined matrices W and V by using the weighted matrices, that is:

$$W=[a_1W_1,a_2W_2,\ldots,a_KW_K]$$

$$V=[a_1V_1^T,a_2V_2^T,\ldots,a_KV_K^T]^T,$$

The matrices are weighted to ensure that the MIMO beamforming system can have excellent performance indexes in a far-field direction. The weighting factors $a_1, a_2, \ldots, a_K$ are positively correlated with the performance of the corresponding channels. That is, the better the performance of the channel is, the larger the weighting factor of the corresponding signal matrix.

A method for determining the weighting factor is described below. The weighting factor $a_j$ of the signal matrix corresponding to the $j^{th}$ channel is:

$$\alpha_j = \frac{\gamma_{max}}{\gamma_j}, j = 1, 2, \ldots, K,$$

$$\gamma_j = 10^{\frac{ACPR_j}{10}}; \gamma_{max} = \max\{\gamma_1, \gamma_2, \ldots, \gamma_K\};$$

where K is the number of channels (i.e., the number of channels subjected to time-division collection), and $ACPR_j$ is the adjacent channel power ratio of the $j^{th}$ channel (i.e., the ratio of the signal power of a primary channel and the signal power of an adjacent channel) and is calculated according to the feedback signal $y'_j$ of the $j^{th}$ path. It is to be noted that the method for calculating the weighting factor is only an example, and other methods may be used for calculation as required.

The parameter estimation module 1824 may be configured to: establish an error target function based on matrices W and V (where V=W*c); extract a correction parameter by using a parameter solution method, and perform multiple iterations to obtain an optimal correction parameter valve c, the optimal correction parameter including the nonlinear distortion pre-compensation parameter, the mismatch compensation parameter and the mutual coupling compensation parameter; and, determine a link imbalance calibration parameter based on the linearly processed forward signal and the linearly processed feedback signals. The link imbalance calibration parameter is used to eliminate IQ imbalance, local oscillator leakage and link ripple. Reference may be made to related technologies for the method for determining the link imbalance calibration parameter.

The parameter solution alterative algorithm used includes, but not limited to, the following:

$$\begin{cases} c(n) = \mu(n) \cdot K(n) \cdot e^H(n) \\ K(n) = \dfrac{\lambda^{-1}P(n-1) \cdot x(n)}{1 + \lambda^{-1}x^H(n) \cdot P(n-1) \cdot x(n)}, \\ P(n) = \lambda^{-1}P(n-1) - \lambda^{-1}K(n) \cdot x^H(n) \cdot P(n-1) \end{cases}$$

$$c(n) = \mu(n) \cdot x(n) \cdot e^H(n), \begin{cases} c(n) = \mu(n) \cdot x(n) \cdot e_h(n) \\ e_h(n) = \sum_{l=0}^{N} h(N-l) \cdot e^H(n-l) \end{cases};$$

where μ and λ are adjustment factors of the alterative algorithm; c(n) is a parameter estimated value of a $n^{th}$ iteration; x(n) is an input signal of the distortion pre-correction model; $(\cdot)^H$ is a conjugate transpose operation of a complex vector; e(n) is a fitted error value of the pre-correction model at the current moment; and, h(n) is a weighting coefficient of an error signal e(n).

Figure 5:
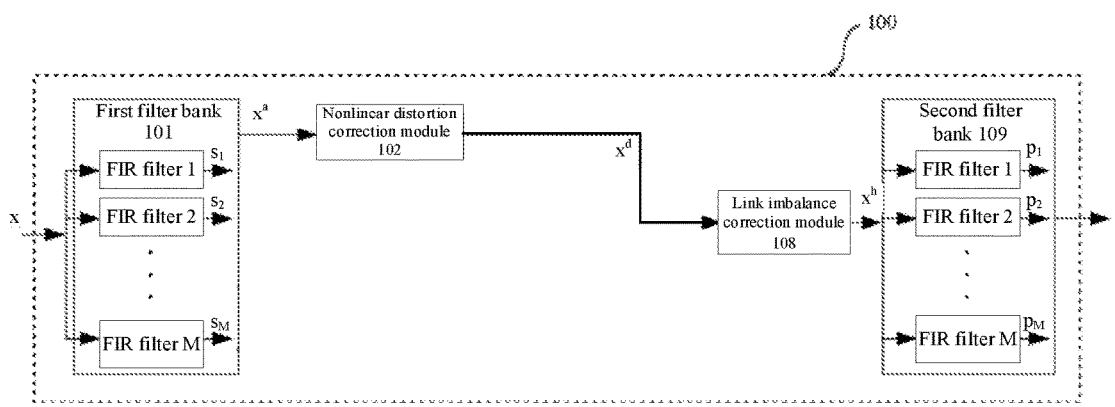
FIG. 5 is a basic structural diagram of a signal distortion correction network module according to an embodiment of the present disclosure.

In an embodiment, as shown in FIG. 5 which is a basic diagram of the signal distortion correction network module 100 according to an embodiment of the present disclosure, the signal distortion correction network module 100 may include a first filter bank 101, a nonlinear distortion correction module 102, a link imbalance correction module 108 and a second filter bank 109.

The first filter bank 101 may be configured to perform rate conversion on the forward signal and output a converted forward signal to the nonlinear distortion correction module 102. The first filter bank 101 may include, for example, a plurality of finite impulse response (FIR) filters which filter the forward signal x in parallel, and output signals $s_1, s_2, \ldots, s_M$ of the filters are arranged in time sequence to obtain a signal $x^a$, so that the rate conversion on the forward signal x is completed.

The nonlinear distortion correction module 102 may be configured to correct the converted forward signal according to the nonlinear distortion pre-compensation parameter in the correction parameter to generate a first corrected signal and output the first corrected signal to the link imbalance correction module 108. In an embodiment, the nonlinear distortion correction module 102 constructs nonlinear basis functions for the output signals of the first filter bank 101 and multiplies the basis functions with the nonlinear distortion pre-compensation parameter, so that the signal distortion caused by the nonlinear characteristics of the power amplifiers is corrected. One implementation will be described below. Nonlinear basis functions $T_1, T_2, T_3, \ldots, T_N$ are constructed by using the output signals $x^a$ of the first filter bank 101, where N is the number of the nonlinear basis functions. Then, the nonlinear basis functions are multiplied with a corresponding model coefficient (i.e., the nonlinear distortion pre-compensation parameter) to obtain a first corrected signal $x^d$ used for counteracting the nonlinear signal distortion generated by the power amplifiers when excited by the forward signal. The specific presentation form of the nonlinear basis functions depends on the signal distortion pre-compensation model employed. The signal distortion pre-compensation model may be multiple groups of low-order filters, a Volterra series, a memory cross polynomial, a neural network (e.g., a BP network, an ART network, etc.), a wavelet network, a support vector machine, etc. It is to be noted that the signal distortion pre-compensation model may not be limited to the above models.

The link imbalance correction module 108 may be configured to process the first corrected signal $x^d$ according to the link imbalance calibration parameter in the correction parameter, and output a fifth corrected signal $x^h$ to the second filter bank 109, so as to correct the I/Q imbalance, local oscillator and link ripple.

The second filter bank 109 may be configured to perform rate conversion on the fifth corrected signal $x^h$ to obtain and output a pre-corrected signal. The second filter bank 109 may include, for example, a plurality of FIR filters to filter the signal $x^h$ in parallel to realize the rate conversion on the transmitted signal, so as to satisfy the subsequent requirement for the rate of the second conversion module 110.

Figure 6:
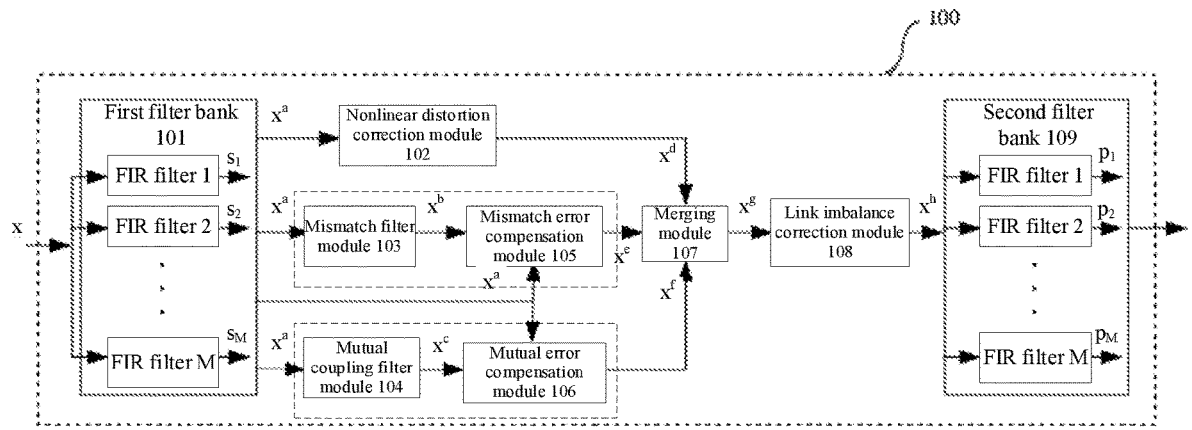
FIG. 6 is another basic structural diagram of the signal distortion correction network module according to an embodiment of the present disclosure.

In another embodiment, as shown in FIG. 6 which is another basic structural diagram of the signal distortion correction network module 100 according to an embodiment of the present disclosure, the signal distortion correction network module 100 may include a first filter bank 101, a nonlinear distortion correction module 102, a merging module 107, a link imbalance correction module 108 and a second filter bank 109. The signal distortion correction network module 100 may further include at least one of a mismatch correction unit including a mismatch filter module 103 and a mismatch error compensation module 105, and a mutual coupling correction unit including a mutual coupling filer module 104 and a mutual coupling error compensation module 106. That is, the signal distortion correction network module 100 may include only the mismatch filter module 103 and the mismatch error compensation module 105, or may include only the mutual coupling filter module 104 and the mutual coupling error compensation module 106, or may include the mismatch filter module 103 and the mismatch error compensation module 105, as well as the mutual coupling filter module 104 and the mutual coupling error compensation module 106. That is, the signal distortion correction network module 100 may only perform mismatch correction, or only perform mutual coupling correction, or perform both mismatch correction and mutual coupling correction. Reference may be made to the above for the functions of the first filter bank 101, the nonlinear distortion correction module 102 and the second filter bank 109, which will not be described here. It is to be noted that, in this embodiment, the first corrected signal output from the nonlinear distortion correction module 102 is inputted into the merging module 107, instead of the link imbalance correction module 108.

The mismatch filter module 103 may be configured to filter (causally filter or non-causally filter) the converted forward signal according to the mismatch filter coefficient in the correction parameter to generate a first intermediate signal $x^b$ (where $x^b$ is used to simulate a standing wave signal caused by the load mismatch at an output terminal of the power amplifier module), and output the first intermediate signal $x^b$ to the mismatch error compensation module 105. That is, the mismatch filter module 103 is configured to simulate the standing wave signal caused by the load mismatch at the output terminal of the power amplifier module.

The mismatch error compensation module 105 may be configured to correct the first intermediate signal $x^b$ according to the mismatch compensation parameter in the correction parameter to obtain a second corrected signal $x^e$, and output the second corrected signal $x^e$ to the merging module 107. In an embodiment, the mismatch error compensation module 105 constructs nonlinear basis functions of the output signals of the mismatch filter module and the first filter bank and multiplies the basis functions with the mismatch filter coefficient, so as to correct the signal distortion caused by the load mismatch. Firstly, nonlinear basis functions $S_1, S_2, S_3, \ldots, S_K$ are constructed by using the output signal $x^a$ of the first fiber bank 101 and the output signal $x^b$ of the mismatch filter module 103, where K is the number of the nonlinear basis functions. Then, these nonlinear basis functions are multiplied with a corresponding coefficient to obtain an error compensation signal $x^e$. The error compensation signal $x^e$ is used to counteract the nonlinear signal distortion generated by the power amplifiers when excited by the standing wave signal caused by the output load mismatch. The specific presentation form of the nonlinear basis functions depends on the mismatch error pre-compensation model employed. The mismatch error pre-compensation model may be multiple groups of low-order filters, a Volterra series, a memory cross polynomial, a neural network (e.g., a BP network, an ART network, etc.), a wavelet network, a support vector machine, etc. It is to be noted that the mismatch error pre-compensation model is not limited to the above models. According to the embodiment of the present disclosure, by correcting the distortion caused by the load mismatch, the influences of the output load mismatch on the system performance can be reduced.

The mutual coupling filter module 104 may be configured to filter (causally filter or non-causally filter) the converted forward signal according to the mutual coupling filter coefficient in the correction parameter to generate a second intermediate signal $x^c$ (where $x^c$ is used to simulate an inter-antenna mutual coupling interference signal at the output terminal of the power amplifier module), and output the second intermediate signal $x^c$ to the mutual coupling error compensation module 106. That is, the mutual coupling filter module 104 may be configured to simulate the inter-antenna mutual coupling interference signal at the output terminal of the power amplifier module.

The mutual coupling error compensation module 106 may be configured to correct the second intermediate signal $x^c$ according to the mutual coupling compensation parameter in the correction parameter to obtain a third corrected signal $x^f$, and output the third corrected signal $x^f$ to the merging module 107. Specifically, the mutual coupling error compensation module 106 constructs nonlinear basis functions of the output signals of the mutual coupling filter module 104 and the first filter bank 101 and multiplies the basis functions with the mutual coupling filter coefficient, so as to correct the signal distortion caused by the inter-antenna mutual coupling. In an embodiment, nonlinear basis functions $R_1, R_2, R_3, \ldots, R_M$ are constructed by using the output signal $x^a$ of the first fiber bank 101 and an output signal $x^c$ of the mutual coupling filter module 104, where M is the number of the nonlinear basis functions. Then, these nonlinear basis functions are multiplied with a corresponding coefficient to obtain a mutual coupling error compensation signal $x^f$. The mutual coupling error compensation signal $x^f$ is used to counteract the nonlinear distortion generated by the power simplifier when excited by inter-antenna mutual coupling. The specific presentation form of the nonlinear basis functions depends on the mutual coupling error pre-compensation model employed. The mutual coupling error pre-compensation model may be multiple groups of low-order filters, a Volterra series, a memory cross polynomial, a neural network (e.g., a BP network, an ART network, etc.), a wavelet network, a support vector machine, etc. It is to be noted that the mutual coupling error pre-compensation model may not be limited to the above models. According to the embodiment of the present disclosure, by correcting the distortion caused by inter-antenna mutual coupling, the influences of the inter-antenna mutual coupling interference on the system performance can be reduced.

The merging module 107 may be configured to merge the inputted signals to obtain a fourth corrected signal $x^g$ and output the fourth corrected signal $x^g$ to the link imbalance correction module 108. The inputted signals may be the first corrected signal and the second corrected signal, or may be the first corrected signal and the third corrected signal, or may be the first corrected signal, the second corrected signal and the third corrected signal. The merging mode is adding the inputted signals.

The link imbalance correction module 108 may be configured to process the fourth corrected signal $x^g$ according to the link imbalance calibration parameter in the correction parameter and output a fifth corrected signal $x^h$ to the second filter bank 109. In an embodiment, the link imbalance correction module 108 performs filtering (linearly processing) to correct I/Q imbalance, in-band ripple, local oscillator leakage or the like of the transmitting link of the system.

With the signal distortion correction network module 100 according to the embodiment of the present disclosure, the signal distortion caused by a nonlinear analog device, the output load mismatch and the inter-antenna coupling interference.

For the MIMO millimeter wave communication system using the analog beamforming technology, an embodiment of the present disclosure provides a device for nonlinear system signal distortion pre-correction. In the correction device, the signal coupling network is controlled by a signal sampling controller, the output signals of the power amplifiers are collected and fed back, and the signal distortion of the MIMO system is effectively pre-compensated by linearly processing multiple paths of data, calculating a mismatch factor and a mutual coupling factor, establishing the signal distortion pre-correction model and extracting model parameters, and the inter-antenna mutual coupling interference can be counteracted. Thus, the performance advantage of the MIMO beamforming system can be further ensured. Compared with the conventional pre-distortion technology, the device can better solve the problem that a pre-distorter pre-compensates the nonlinear system signal distortion in application scenarios of a plurality of power amplifiers.

The device for signal distortion pre-correction according to the embodiment of the present disclosure has the following advantages.

1) The signal sampling controller controls the coupling network to realize time-division collection feedback of the output signals of the power amplifiers, so that the requirements for the consistency of the characteristics of the power amplifiers in the system are relatively low.

2) During the extraction of the correction parameter, the constructed signal matrices are weighted, so that the performance indexes in the beamforming are optimal.

3) By linearly processing the feedback signals of the power amplifiers in parallel, the influences on the performance of the distortion correction algorithm from the delay, phase and amplitude differences between coupling feedback links can be eliminated.

4) Since the feedback signals of the power amplifiers can be linearly processed, the beam is at an arbitrary angle during the extraction of the correction parameter and is not limited to 0° beam, and the distortion pre-correction performance in the far-field beam direction can be ensured.

5) The influences on the system performance from the output load mismatch and the inter-antenna mutual coupling interference can be reduced.

Compared with the distortion correction devices in the related technologies, the correction device according to the embodiments of the present disclosure provides a novel signal distortion pre-correction algorithm which can correct the overall nonlinear distortion of multiple parallel power amplifiers and reduces the influences from factors such as the output load mismatch and the inter-antenna coupling interference. In addition, a feedback link channel can be used to realize the time-division collection on the output signals of the channels. The device for signal distortion pre-correction according to the embodiments of the present disclosure can be applied not only to wireless communication systems using the analog beamforming technology, for example, millimeter wave communication systems, but also to communication systems where the characteristics of the power amplifiers are greatly affected by standing waves.

In the device for signal distortion pre-correction according to the embodiments of the present disclosure, the inputted data signal (i.e., the forward signal) can be a service signal or a training sequence, and the requirements for the consistency of the characteristics of the power amplifiers are relatively low. When the consistency of the characteristics of the power amplifiers is relatively high, the selection switch of the feedback link in the signal coupling network module can be fixed on a certain channel for feedback signal collection and subsequent operations.

Figure 7:
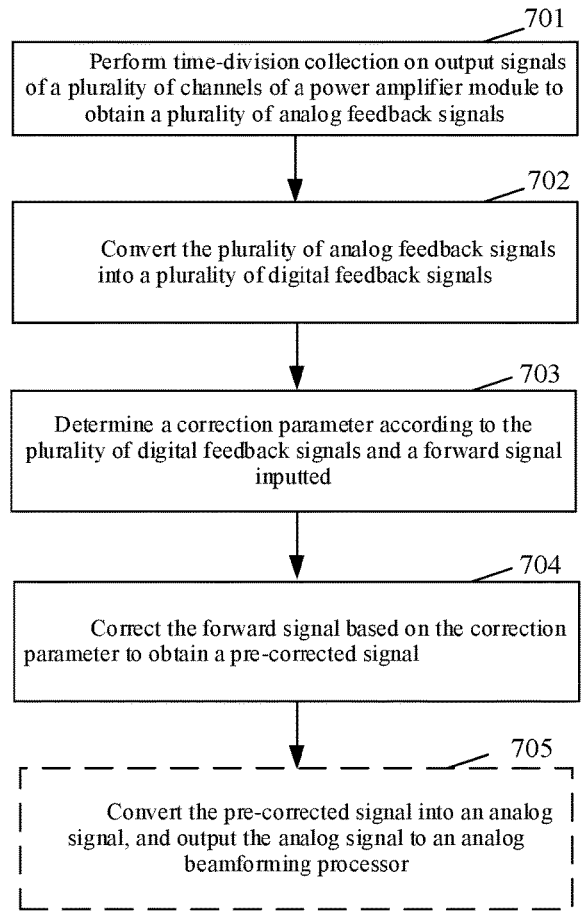
FIG. 7 is a flowchart of a method for signal distortion pre-correction according to an embodiment of the present disclosure.

An embodiment of the present disclosure further provides a method for signal distortion pre-correction. As shown in FIG. 7, which is a flowchart of the method for signal distortion pre-correction according to the embodiment of the present disclosure, the method includes steps S701 to S704.

In a step of S701, time-division collection is performed on output signals of a plurality of channels of a power amplifier module to obtain a plurality of analog feedback signals.

In a step of S702, the plurality of analog feedback signals are converted into a plurality of digital feedback signals.

In a step of S703, a correction parameter is determined according to the plurality of digital feedback signals and a forward signal inputted.

In a step of S704, the forward signal is corrected based on the correction parameter to obtain a pre-corrected signal.

In another embodiment, the method may further include a step of S705.

In the step of S705, the pre-corrected signal is converted into an analog signal, and the analog signal is output to an analog beamforming processor.

In an embodiment, the determining a correction parameter according to the plurality of digital feedback signals and a forward signal inputted may include: linearly processing the forward signal and the plurality of digital feedback signals to obtain a linearly processed forward signal and linearly processed digital feedback signals; constructing a plurality of signal matrices based on a preset signal distortion pre-correction model, the linearly processed forward signal, the linearly processed digital feedback signals and the pre-corrected signal, the signal matrices corresponding to the collected channels; weighting the plurality of signal matrices by using weighting factors to generate a combined matrix by using the weighted signal matrices; acquiring a nonlinear distortion pre-compensation parameter, a mismatch compensation parameter and a mutual coupling compensation parameter based on the combined matrix; and determining a link imbalance calibration parameter based on the linearly processed forward signal and the linearly processed digital feedback signals, the weighting factor of a signal matrix being positively correlated with the performance of a channel corresponding to the signal matrix.

In an embodiment, a weighting factor $\alpha_j$ of a signal matrix corresponding to a $j^{th}$ channel is:

$$\alpha_j = \frac{\gamma_{max}}{\gamma_j}, j = 1, 2, ..., K,$$

$$\gamma_j = 10^{\frac{ACPR_j}{10}}; \gamma_{max} = \max\{\gamma_1, \gamma_2, ..., \gamma_K\};$$

where K is the number of channels, $ACPR_j$ is the ACPR of the $j^{th}$ channel, i.e., a ratio of the signal powers of an adjacent channel and a primary channel of the $j^{th}$ channel.

In an embodiment, the determining a correction parameter according to the plurality of digital feedback signals and a forward signal inputted may include: linearly processing the forward signal and the plurality of digital feedback signals to obtain a linearly processed forward signal and linearly processed digital feedback signals; determining a mismatch filter coefficient and a mutual coupling filter coefficient according to a power amplifier model of the power amplifier module, the linearly processed forward signal and the linearly processed digital feedback signals; constructing a plurality of signal matrices based on the signal distortion pre-correction model, the mismatch filter coefficient, the mutual coupling filter coefficient, the linearly processed forward signal, the linearly processed digital feedback signals and the pre-corrected signal, the signal matrices corresponding to the collected channels; and weighting the plurality of signal matrices by using weighting factors, generating a combined matrix by using weighted signal matrices, acquiring a nonlinear distortion pre-compensation parameter, a mismatch compensation parameter and a mutual coupling compensation parameter based on the combined matrix, and determining a link imbalance calibration parameter based on the linearly processed forward signal and the linearly processed digital feedback signals, the weighting factor of a signal matrix being positively correlated with the performance of a channel corresponding to the signal matrix.

In an embodiment, the signal matrix corresponding to the $j^{th}$ channel is:

$$W_j = \begin{bmatrix} x_j(n) \cdot f_{00}^n & x_j(n) \cdot f_{01}^n & \cdots & x_j(n-L) \cdot f_{LQ}^n \\ x_j(n+1) \cdot f_{00}^{n+1} & x_j(n+1) \cdot f_{01}^{n+1} & \cdots & x_j(n+1-L) \cdot f_{LQ}^{n+1} \\ \vdots & \vdots & \ddots & \vdots \\ x_j(n+N) \cdot f_{00}^N & x_j(n+N) \cdot f_{00}^N & \cdots & x_j(n+N-L) \cdot f_{LQ}^N \end{bmatrix},$$

$$V_j = \begin{bmatrix} x_j(n) + z_j(n) - y'_j(n) \\ x_j(n+l) + z_j(n+l) - y'_j(n+1) \\ \vdots \\ x_j(n+N) + z_j(n+N) - y'_j(n+N) \end{bmatrix};$$

where $$f_{lk}^n = \sum_{p=0}^{k} [h_a * x_j(n-l) + h_b * x_j(n-l)]^p \cdot |x_j(n-l)|^{k-p},$$

$x_j$ is the linearly processed forward signal, $z_j$ is the pre-corrected signal, $y'_j$ is the linearly processed digital feedback signal, $h_a$ is the mismatch filter coefficient, $h_b$ is the mutual coupling filter coefficient, L and Q are memory depth and nonlinear order of the signal distortion pre-correction model, respectively, and N+1 is a data length used to construct the signal matrices.

In an embodiment, the correcting the forward signal inputted based on the correction parameter to obtain a pre-corrected signal may include: performing rate conversion on the forward signal to obtain a converted forward signal; correcting the converted forward signal according to the nonlinear distortion pre-compensation parameter in the correction parameter to generate a first corrected signal; processing the first corrected signal according to the link imbalance calibration parameter in the correction parameter to obtain a fifth corrected signal; and performing rate conversion on the fifth corrected signal to obtain the pre-corrected signal, and outputting the pre-corrected signal.

In an embodiment, the correcting the forward signal inputted based on the correction parameter to obtain a pre-corrected signal may include: performing rate conversion on the forward signal to obtain a converted forward signal; correcting the converted forward signal according to the nonlinear distortion pre-compensation parameter in the correction parameter to generate a first corrected signal; filtering the converted forward signal according to the mismatch filter coefficient in the correction parameter to generate a first intermediate signal; correcting the first intermediate signal according to the mismatch compensation parameter in the correction parameter to obtain a second corrected signal; filtering the converted forward signal according to the mutual coupling filter coefficient in the correction parameter to generate a second intermediate signal; correcting the second intermediate signal according to the mutual coupling compensation parameter in the correction parameter to obtain a third corrected signal; merging the first corrected signal and the second corrected signal, or the first corrected signal and the third corrected signal, or the first corrected signal, the second corrected signal and the third corrected signal to obtain a fourth corrected signal; processing the fourth corrected signal according to the link imbalance calibration parameter in the correction parameter to generate a fifth corrected signal; and performing rate conversion on the fifth corrected signal to obtain the pre-corrected signal, and outputting the pre-corrected signal.

An embodiment of the present disclosure further provides a system for signal distortion pre-correction. Referring to FIG. 2, the system for signal distortion pre-correction includes the device for signal distortion pre-correction according to the embodiments of the present disclosure, a second conversion module 110, an analog beamforming processor 120 and a power amplifier module 130.

The device for signal distortion pre-correction may further be configured to output the pre-corrected signal to the second conversion module 110.

The second conversion module 110 may be configured to convert the pre-corrected signal into an analog signal and output the analog signal to the analog beamforming processor 120.

The analog beamforming processor 120 may be configured to weight an amplitude and phase of the inputted analog signal to generate a weighted analog signal and output the weighted analog signal to the power amplifier module 130. The weighting is performed to facilitate the output signal of the subsequent antenna array to form a beam with a preset direction.

The power amplifier module 130 may be configured to amplify and output the weighted analog signal.

The device and method for signal distortion pre-correction according to the embodiments of the present disclosure will be described below in detail with reference to the accompanying drawings and the application scenario of a 5G millimeter wave communication system.

Figure 8:
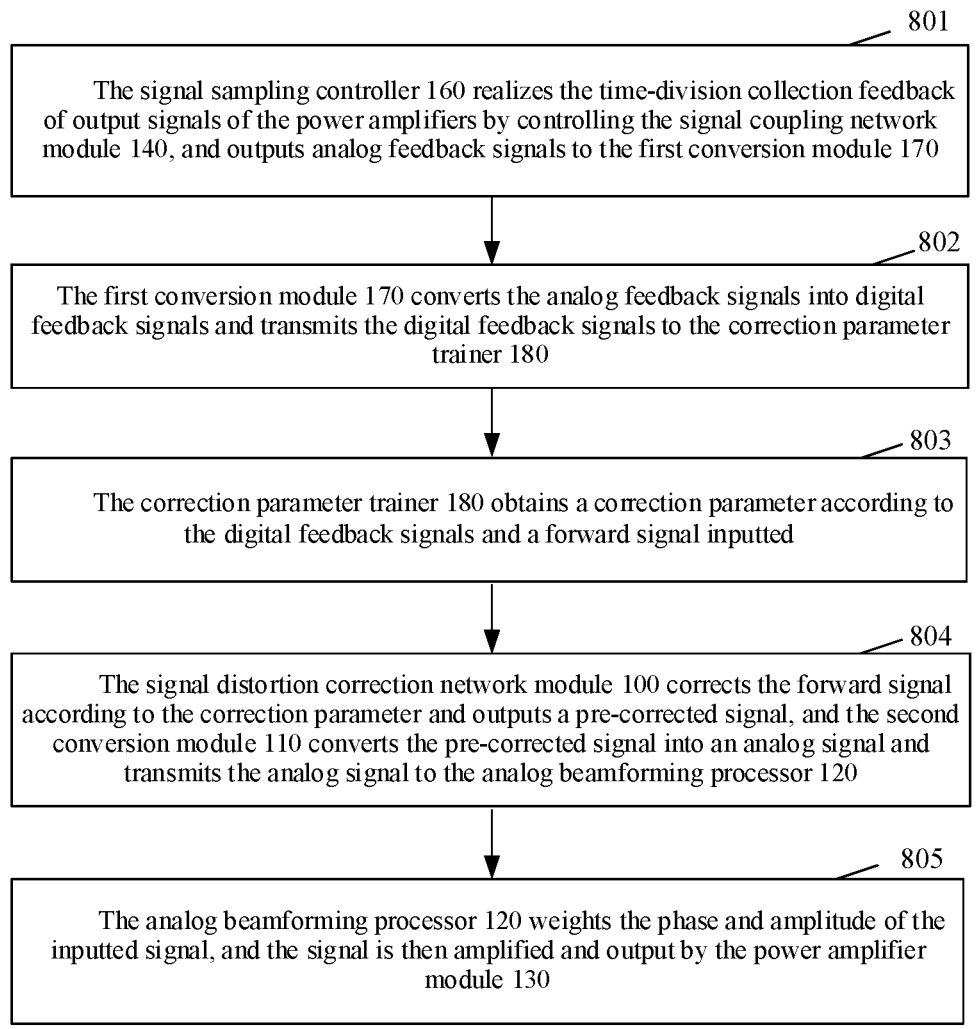
FIG. 8 is another flowchart of the method for signal distortion pre-correction according to an embodiment of the present disclosure.

FIG. 8 is another flowchart of the method for signal distortion pre-correction according to an embodiment of the present disclosure. As shown in FIG. 8, the method may be applied to the device for signal distortion pre-correction according to the embodiment of the present disclosure shown in FIG. 3. The method includes steps of S801 to S805.

In a step of S801, the signal sampling controller 160 realizes time-division collection feedback of output signals of power amplifiers by controlling the signal coupling network module 140, and outputs analog feedback signals to the first conversion module 170.

In a step of S802, the first conversion module 170 converts the analog feedback signals into digital feedback signals and transmits the digital feedback signals to the correction parameter trainer 180.

In a step of S803, the correction parameter trainer 180 acquires a correction parameter according to the digital feedback signals and an inputted forward signal. The correction parameter may include a nonlinear distortion precompensation parameter, a mismatch compensation parameter, a mutual coupling compensation parameter and a link imbalance calibration parameter.

In an embodiment, the correction parameter trainer 180 linearly processes multiple paths of data of the output signals $y=[y_1, y_2, \ldots, y_K]$ of the first conversion module 170 based on the forward signal $x=[x_1, x_2, \ldots, x_K]$ to obtain preprocessed signals; then solves a mismatch filter coefficient and a mutual coupling filter coefficient by using the obtained preprocessed signals; and, constructs a target function of the signal distortion correction model, and solves an iterative algorithm by using the parameters to obtain a final correction parameter c, where K is the number of channels subjected to the time-division collection, and is the number of parallel power amplifiers when one channel includes one power amplifier. It is to be noted that K is less than or equal to the number of channels of the power amplifier module 130.

In addition, the correction parameter trainer 180 can obtain the link imbalance calibration parameter according to the digital feedback signals and the forward signal inputted.

In a step of S804, the correction parameter in the signal distortion correction network module 100 is updated in real time according to the correction parameter c provided by the correction parameter trainer 180; the signal distortion correction network module 100 pre-corrects the nonlinear distortion and linear distortion of the signal x at a high sampling rate according to the forward signal x and amplitude information thereof, and transmits a pre-corrected signal z to the second conversion module 110; and the second conversion module 110 converts the pre-corrected signal (which is a digital signal) into an analog signal and transmits the analog signal to the analog beamforming processor 120.

In a step of S805, the analog beamforming processor 120 weights the phase and amplitude of the inputted signal and outputs the signal, and the output signal of the analog beamforming processor 120 is amplified by the power amplifiers of the power amplifier module 130 and then directly transmitted to the antenna array module 150 for radiation in the space. The analog beamforming processor 120 may weigh the phase and amplitude of the inputted signal by an analog device such as an adjustable attenuator and a phase shifter.

Figure 9:
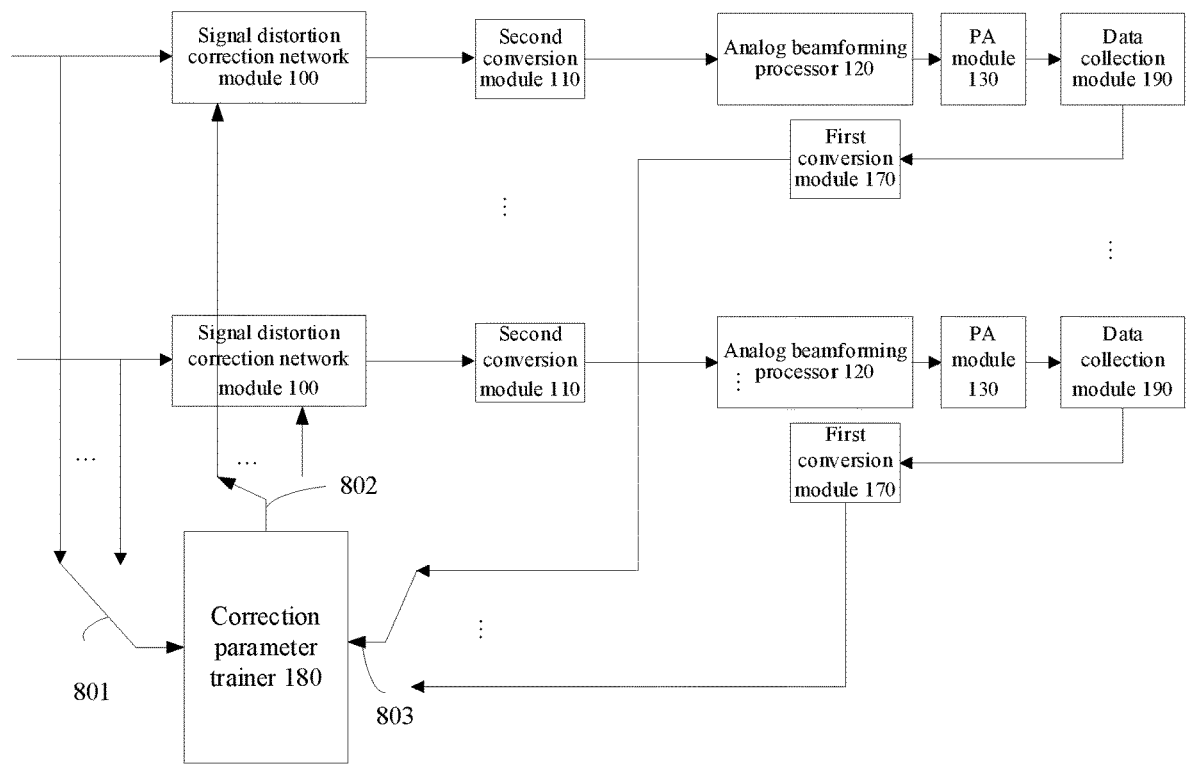
FIG. 9 is a schematic structural diagram of a composite system for signal distortion pre-correction according to an embodiment of the present disclosure.

An embodiment of the present disclosure further provides a composite system for signal distortion pre-correction. FIG. 9 is a schematic structural diagram of the composite system for signal distortion pre-correction according to the embodiment of the present disclosure. As shown in FIG. 9, the composite system for signal distortion pre-correction includes a plurality of systems for signal distortion pre-correction which multiplex a same correction parameter trainer 180. The correction parameter trainer 180 is connected to related modules in the systems for signal distortion pre-correction through selection switches. In an embodiment, the correction parameter trainer 180 is connected to an input terminal of each system for signal distortion pre-correction through a first selection switch 801, connected to the signal distortion correction network module 100 of each system for signal distortion pre-correction through a second selection switch 802, and connected to the first conversion module 170 of each system for signal distortion pre-correction through a third selection switch 803.

Figure 10:
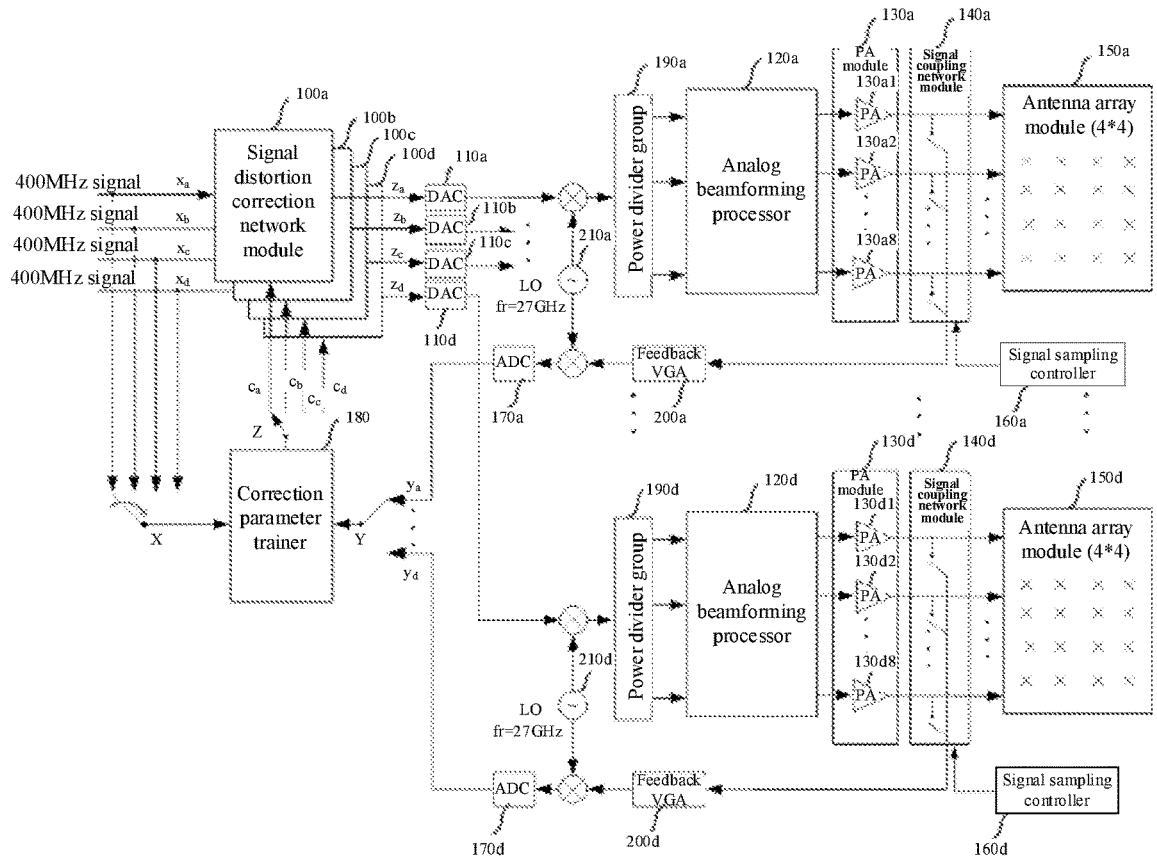
FIG. 10 is another schematic structural diagram of the composite system for signal distortion pre-correction according to an embodiment of the present disclosure.

As shown in FIG. 10, which is another schematic structural diagram of the composite system for signal distortion pre-correction according to an embodiment of the present disclosure, the composite system for signal distortion pre-correction is applicable to MIMO millimeter wave communication systems.

In an embodiment, in an MIMO downlink transmission system using the analog beamforming technology, the number of digital channels and the number of analog RF channels are set as 4 and 32, respectively. One digital channel corresponds to eight analog RF channels, and the output of one analog RF channel is connected to two antenna elements. Meanwhile, it is assumed that signals transmitted by the four digital channels are 400 MHz baseband signals containing 10 sub-carriers, i.e., $x_a$, $x_b$, $x_c$ and $x_d$.

The correction process of the nonlinear system signal distortion will be described in detail below by taking the signal transmission of the digital channel 1 as an example. The signal transmissions of other digital channels are similar and will not be repeated here. The related signals of different digital channels are distinguished by subscripts a, d, c and d.

In a step of S1001, the signal sampling controller 160a realizes time-division collection on the output signals of the power amplifiers by controlling the signal coupling network module 1401 to obtain a feedback signal $y_i(t)(i=1, 2, \ldots, 8)$, and adjusts gain of the feedback signal $y_i(t)$ by a feedback VGA 200a, thereby ensuring that the amplitude of the feedback signal is not too small to affect the extraction and training of the distortion correction parameter.

In a step of S1002, the module 210a generates a local oscillating signal having a frequency of fr=27 GHz, and the RF signal $y_t(t)$ is shifted to a zero intermediate frequency, and transferred through the ADC module 170a to output a digital signal $y_a[y_1, y_2, \ldots, y_8]$.

In a step of S1003, after the correction parameter trainer 180 is connected to the forward link and feedback link of the digital channel 1, respectively by selection stwitches X and Y, data linear processing operations such as delay alignment, mirror calibration and complex gain compensation are performed on the forward signal $x_i$ and the feedback collected signal $y_i$ (i=1, 2, ..., 8) to obtain a preprocessed signal $y'_i$ (i=1, 2, ..., 8). Then, approximation fitting is performed on the signal $y'_i$ based on the power amplifier model by using the forward signal $x_i$, and estimated values of the mismatch filter coefficient $h_a$ and the mutual coupling filter coefficient $h_b$ are calculated by a LS method. Subsequently, signal matrixes $W_1, W_2, \ldots, W_8$ and $V_1, V_2, \ldots, V_8$ are constructed according to the signal distortion pre-correction model employed, values of weighting factors $a_1, a_2, \ldots, a_8$ are determined, and the constructed matrices are weighted to obtain combined matrices W and V. Finally, the distortion pre-correction parameters are iteratively calculated for multiple times by an iterative method to obtain an optimal value c of the correction parameter.

In a step of S1004, the correction parameter value c obtained by the correction parameter trainer 180 is copied to the signal distortion correction network module 1001 through a selection switch Z, and the correction parameter in the signal distortion correction network module 100a is correspondingly updated.

In a step of S1005, according to the 400 MHz baseband signal $x_a=[x_1, x_2, \ldots, x_K]$ and its amplitude value transmitted on the digital channel 1, the signal distortion correction network module 100a performs mismatch and mutual coupling filtering at a high sampling rate to construct nonlinear basis functions, and then multiplies the nonlinear basis functions with the corresponding correction parameter to perform distortion pre-compensation operation on the forward signal $x_a$, so as to obtain a pre-corrected signal $z_a$. This signal is converted into an analog signal by the DAC (module) 110a.

In a step of S1006, the module 210a provides a local oscillating signal having a frequency of $f_r$=27 GHz and an output signal of the DAC (module) 110a is shifted to a RF terminal. The transmitted RF signal is processed by a power amplifier set 109a and then transmitted in parallel on eight analog RF channels, so that the signal power becomes ⅛ of the original signal power. A analog beamforming processor 120a weights the amplitude and phase of the transmitted RF signal in the eight analog channels by using a steering vector[$\beta_0, \beta_1 e^{-j2\pi d sin\theta}, \ldots, \beta_7 e^{-j7*2\pi d sin\theta}$], so as to form a beam with a particular direction. An output signal of the power amplifier processor 120a is amplified by eight parallel power amplifiers of the power amplifier module 130a and directly transmitted to an antenna array module 150a for radiation in the space. It is to be noted that, $\beta_0, \beta_1, \ldots, \beta_7$ are signal amplitude weighted values on the analog RF channels, d is a distance between antenna elements, and θ is an included angle of the beam direction.

In an example embodiment, each of the antenna array modules 150a, 150b, 150c and 105d may use 16 antenna elements in a layout of 4*4 antenna area arrays. The four digital channels share one correction parameter trainer 180. The correction parameter trainer 180 is connected to the forward transmitting link, the signal distortion correction network and the coupling feedback link of each digital channel, respectively by selection switches X, Z, and Y Thus, the demand for hardware requirements of the transmitter can be reduced, and the power consumption of the system can also be greatly reduced.

The detailed description of the embodiments of the present disclosure is provided to enable those having ordinary skill in the art to manufacture or use the present disclosure. Various modifications to the embodiments of the present disclosure are readily understood by those having ordinary skill in the art.

It should be understood by those having ordinary skill in the art that, all or some of the steps in the methods described above and the functional modules/units in the systems and devices described above can be implemented as software, firmware, hardware and proper combinations thereof. In the hardware implementation, the division of the functional modules/units mentioned above does not necessarily correspond to the division of physical components. For example, one physical component may have a plurality of functions, or one function or step may be cooperatively executed by a number of physical components. Some or all of the components may be implemented as software executed by processors such as digital signal processors or microprocessors, or implemented as hardware, or implemented as integrated circuits such as application-specific integrated circuits. Such software may be distributed on a computer-readable medium, and the computer-readable medium may include computer storage medium (or non-temporary medium) and communication medium (or temporary medium). As well-known to those having ordinary skill in the art, the term computer storage medium includes volatile or non-volatile and removable or non-removable medium implemented in any method or technology for storing information (e.g., computer-readable instructions, data structures, program modules or other data). The computer storage medium includes, but not limited to, RAM, ROM, EEPROM, flash memory or other memory technologies, CD-ROM, digital video disk (DVD) or other optical disk storages, magnetic cassette, magnetic tape, magnetic disk storage or other magnetic storage devices, or any other mediums which can be used to store desired information and can be accessed by computers. In addition, as well-known to those having ordinary skill in the art, the communication medium generally contains computer-readable instructions, data structures, program modules or other data in modulation data signals such as carriers or other transmission mechanisms, and may include any information transfer medium.

The invention claimed is:

1. A device for signal distortion pre-correction, comprising: a signal distortion correction network module, a correction parameter trainer, a data collection module and a first conversion module, the data collection module being connected to a power amplifier module, wherein:
   the data collection module is configured to perform time-division collection on output signals of a plurality of channels of the power amplifier module and output a plurality of analog feedback signals to the first conversion module;
   the first conversion module is configured to convert the plurality of analog feedback signals into a plurality of digital feedback signals and transmit the plurality of digital feedback signals to the correction parameter trainer;
   the correction parameter trainer is configured to determine a correction parameter according to the plurality of digital feedback signals and a forward signal inputted and output the correction parameter to the signal distortion correction network module; and the signal distortion correction network module is configured to correct the forward signal based on the correction parameter and output a pre-corrected signal, wherein the correction parameter trainer comprises a data linear processing module and a correction parameter calculation module, wherein:

the data linear processing module is configured to linearly process the forward signal and the plurality of digital feedback signals to obtain a linearly processed forward signal and linearly processed digital feedback signals; and the correction parameter calculation module is configured to: construct a plurality of signal matrices based on a preset signal distortion pre-correction model, the linearly processed forward signal, the linearly processed digital feedback signals and the pre-corrected signal; weight each of the plurality of signal matrices by using a respective weighting factor to generate a combined matrix; acquire a nonlinear distortion pre-compensation parameter based on the combined matrix; and determine a link imbalance calibration parameter based on the linearly processed forward signal and the linearly processed digital feedback signals;

wherein at least one of the plurality of signal matrices corresponds to a collected channel in the plurality of channels, and a weighting factor corresponding to the at least one signal matrix is positively correlated with performance of the collected channel corresponding to the at least one signal matrix.

2. The device for signal distortion pre-correction of claim 1, wherein a weighting factor $a_j$ of a signal matrix corresponding to a $j^{th}$ channel in the plurality of channels is:

$$\alpha_j = \frac{\gamma_{max}}{\gamma_j}, j = 1, 2, ..., K,$$

$$\gamma_j = 10^{\frac{ACPR_j}{10}}, \gamma_{max} = \max\{\gamma_1, \gamma_2, ..., \gamma_K\};$$

wherein K is a total number of channels in the plurality of channels, $ACPR_j$ is an adjacent channel power ratio of the $j^{th}$ channel, and $\gamma_j$ is a decimal value for $ACPR_j$.

3. The device for signal distortion pre-correction of claim 1, wherein the signal distortion correction network module comprises a first filter bank, a nonlinear distortion correction module, a link imbalance correction module and a second filter bank, wherein:

the first filter bank is configured to perform rate conversion on the forward signal and output a converted forward signal to the nonlinear distortion correction module;

the nonlinear distortion correction module is configured to correct the converted forward signal according to the nonlinear distortion pre-compensation parameter in the correction parameter to generate a first corrected signal and output the first corrected signal to the link imbalance correction module;

the link imbalance correction module is configured to process the first corrected signal according to the link imbalance calibration parameter in the correction parameter and output a fifth corrected signal to the second filter bank; and the second filter bank is configured to perform rate conversion on the fifth corrected signal and output the pre-corrected signal.

4. The device for signal distortion pre-correction of claim 1, wherein wherein the correction parameter calculation module is further configured to: determine a mismatch filter coefficient and a mutual coupling filter coefficient according to a power amplifier model of the power amplifier module, the linearly processed forward signal and the linearly processed digital feedback signals; construct the plurality of signal matrices based on the preset signal distortion pre-correction model, the mismatch filter coefficient, the mutual coupling filter coefficient, the linearly processed forward signal, the linearly processed digital feedback signals and the pre-corrected signal; weight each of the plurality of signal matrices by using a respective weighting factor to generate the combined matrix; acquire the nonlinear distortion pre-compensation parameter, a mismatch compensation parameter and a mutual coupling compensation parameter based on the combined matrix.

5. The device for signal distortion pre-correction of claim 4, wherein a signal matrix corresponding to a $j^{th}$ channel in the plurality of channels is:

$$W_j = \begin{bmatrix} x_j(n) \cdot f_{00}^n & x_j(n) \cdot f_{01}^n & \cdots & x_j(n-L) \cdot f_{LQ}^n \\ x_j(n+1) \cdot f_{00}^{n+1} & x_j(n+1) \cdot f_{01}^{n+1} & \cdots & x_j(n+1-L) \cdot f_{LQ}^{n+1} \\ \vdots & \vdots & \ddots & \vdots \\ x_j(n+N) \cdot f_{00}^N & x_j(n+N) \cdot f_{00}^N & \cdots & x_j(n+N-L) \cdot f_{LQ}^N \end{bmatrix},$$

$$V_j = \begin{bmatrix} x_j(n) + z_j(n) - y'_j(n) \\ x_j(n+l) + z_j(n+l) - y'_j(n+1) \\ \vdots \\ x_j(n+N) + z_j(n+N) - y'_j(n+N) \end{bmatrix},$$

wherein $W_j$ is a signal matrix constructed based on signal $x_j(n)$ of the $j^{th}$ channel, $V_j$ is a signal matrix constructed based on signals $x_j(n)$, $y'_j(n)$ and $z_j(n)$ of the $j^{th}$ channel, $$f_{lk}^n = \sum_{p=0}^{k} [h_a * x_j(n-l) + h_b * x_j(n-l)]^p \cdot |x_j(n-l)|^{k-p},$$

which is a nonlinear basis function, $(\cdot)^p$ is a $p^{th}$ power of $(\cdot)$, with p having a range of [0, k], k is an intermediate variable having a range of [0,Q], $X_j$ is the linearly processed forward signal, $z_j$ is the pre-corrected signal, $y'_j$ is the linearly processed digital feedback signal, n and l are data index, $h_a$ is the mismatch filter coefficient, $h_b$ is the mutual coupling filter coefficient, L and Q are memory depth and nonlinear order of the preset signal distortion pre-correction model, respectively, and N+1 is a data length used to construct the plurality of signal matrices.

6. The device for signal distortion pre-correction of claim 4, wherein the signal distortion correction network module comprises: a first filter bank, a nonlinear distortion correction module, a merging module, a link imbalance correction module and a second filter bank; and the signal distortion correction network module further comprises at least one of a mismatch correction unit comprising a mismatch filter module and a mismatch error compensation module, and a mutual coupling correction unit comprising a mutual coupling filter module and a mutual coupling error compensation module, wherein:

the first filter bank is configured to perform rate conversion on the forward signal and output a converted forward signal to the nonlinear distortion correction module, the mismatch filter module and the mutual coupling filter module;

the nonlinear distortion correction module is configured to correct the converted forward signal according to the nonlinear distortion pre-compensation parameter in the correction parameter to generate a first corrected signal and output the first corrected signal to the merging module;

the mismatch filter module is configured to filter the converted forward signal according to the mismatch filter coefficient in the correction parameter to generate a first intermediate signal and output the first intermediate signal to the mismatch error compensation module;

the mismatch error compensation module is configured to correct the first intermediate signal according to the mismatch compensation parameter in the correction parameter to obtain a second corrected signal and output the second corrected signal to the merging module;

the mutual coupling filter module is configured to filter the converted forward signal according to the mutual coupling filter coefficient in the correction parameter to generate a second intermediate signal and output the second intermediate signal to the mutual coupling error compensation module;

the mutual coupling error compensation module is configured to correct the second intermediate signal according to the mutual coupling compensation parameter in the correction parameter to obtain a third corrected signal and output the third corrected signal to the merging module;

the merging module is configured to merge inputted signals to obtain a fourth corrected signal and output the fourth corrected signal to the link imbalance correction module;

the link imbalance correction module is configured to process the fourth corrected signal according to the link imbalance calibration parameter in the correction parameter and output a fifth corrected signal to the second filter bank; and the second filter bank is configured to perform rate conversion on the fifth corrected signal and output the pre-corrected signal.

7. The device for signal distortion pre-correction of claim 1, wherein the data collection module comprises a signal coupling network module and a signal sampling controller, the signal coupling network module being connected to the power amplifier module, wherein:

the signal sampling controller is configured to control the signal coupling network module to realize the time-division collection on output signals of the plurality of channels; and the signal coupling network module is configured to perform time-division coupling to the output signals of the plurality of channels according to control of the signal sampling controller and output the plurality of analog feedback signals to the first conversion module.

8. A system for signal distortion pre-correction, comprising the device for signal distortion pre-correction of claim 1, a second conversion module, an analog beamforming processor and the power amplifier module, wherein:

the device for signal distortion pre-correction is further configured to output the pre-corrected signal to the second conversion module;

the second conversion module is configured to convert the pre-corrected signal into an analog signal and output the analog signal to the analog beamforming processor;

the analog beamforming processor is configured to weight an amplitude and phase of the inputted analog signal to generate a weighted analog signal and output the weighted analog signal to the power amplifier module; and the power amplifier module is configured to amplify and output the weighted analog signal.

9. A composite system for signal distortion pre-correction, comprising a plurality of systems for signal distortion pre-correction of claim 8, wherein the plurality of systems for signal distortion pre-correction multiplex a same correction parameter trainer, and the correction parameter trainer is connected to related modules in the plurality of systems for signal distortion pre-correction through at least one selection switch.

10. The system for signal distortion pre-correction of claim 9, wherein a weighting factor $\alpha_j$ of a signal matrix corresponding to $j^{th}$ channel in the plurality of channels is:

$$\alpha_j = \frac{\gamma_{max}}{\gamma_j}, j = 1, 2, ..., K,$$

$$\gamma_j = 10^{\frac{ACPR_j}{10}}; \gamma_{max} = \max\{\gamma_1, \gamma_2, ..., \gamma_K\};$$

wherein K is a total number of channels in the plurality of channels, $ACPR_j$ is an adjacent channel power ratio of the $j^{th}$ channel, and $\gamma_j$ is a decimal value for $ACPR_j$.

11. The system for signal distortion pre-correction of claim 8, wherein the correction parameter calculation module is further configured to: determine a mismatch filter coefficient and a mutual coupling filter coefficient according to a power amplifier model of the power amplifier module, the linearly processed forward signal and the linearly processed digital feedback signals; construct the plurality of signal matrices based on the preset signal distortion pre-correction model, the mismatch filter coefficient, the mutual coupling filter coefficient, the linearly processed forward signal, the linearly processed digital feedback signals and the pre-corrected signal; weight each of the plurality of signal matrices by using a respective weighting factor to generate the combined matrix; acquire the nonlinear distortion pre-compensation parameter, a mismatch compensation parameter and a mutual coupling compensation parameter based on the combined matrix.

12. A method for signal distortion pre-correction, comprising:

performing time-division collection on output signals of a plurality of channels of a power amplifier module to obtain a plurality of analog feedback signals;

converting the plurality of analog feedback signals into a plurality of digital feedback signals;

determining a correction parameter according to the plurality of digital feedback signals and a forward signal inputted; and correcting the forward signal based on the correction parameter to obtain a pre-corrected signal;

wherein the determining a correction parameter according to the plurality of digital feedback signals and a forward signal inputted comprises:

linearly processing the forward signal and the plurality of digital feedback signals to obtain a linearly processed forward signal and linearly processed digital feedback signals;

constructing a plurality of signal matrices based on a preset signal distortion pre-correction model, the linearly processed forward signal, the linearly processed digital feedback signals and the pre-corrected signal; and weighting each of the plurality of signal matrices by using a respective weighting factor to generate a combined matrix, acquiring a nonlinear distortion pre-compensation parameter based on the combined matrix, and determining a link imbalance calibration parameter based on the linearly processed forward signal and the linearly processed digital feedback signals;

wherein at least one of the plurality of signal matrices corresponds to a collected channel in the plurality of channels, and a weighting factor corresponding to the at least one signal matrix is positively correlated with performance of the collected channel corresponding to the at least one signal matrix.

13. The method for signal distortion pre-correction of claim 12, wherein a weighting factor $a_j$ of a signal matrix corresponding to a $j^{th}$ channel in the plurality of channels is:

$$\alpha_j = \frac{\gamma_{max}}{\gamma_j}, j = 1, 2, ..., K,$$

$$\gamma_j = 10^{\frac{ACPR_j}{10}}; \gamma_{max} = \max\{\gamma_1, \gamma_2, ..., \gamma_K\};$$

wherein K is a total number of channels in the plurality of channels, $ACPR_j$ is an adjacent channel power ratio of the $j^{th}$ channel, and $\gamma_j$ is a decimal value for $ACPR_j$.

14. The method for signal distortion pre-correction of claim 12, wherein the correcting the forward signal inputted based on the correction parameter to obtain a pre-corrected signal comprises:

performing rate conversion on the forward signal to obtain a converted forward signal;

correcting the converted forward signal according to the nonlinear distortion pre-compensation parameter in the correction parameter to generate a first corrected signal;

processing the first corrected signal according to the link imbalance calibration parameter in the correction parameter to obtain a fifth corrected signal; and performing rate conversion on the fifth corrected signal to obtain the pre-corrected signal, and outputting the pre-corrected signal.

15. The method for signal distortion pre-correction of claim 12, wherein the determining a correction parameter according to the plurality of digital feedback signals and the forward signal inputted further comprises:

determining a mismatch filter coefficient and a mutual coupling filter coefficient according to a power amplifier model of the power amplifier module, the linearly processed forward signal and the linearly processed digital feedback signals;

constructing the plurality of signal matrices based on the preset signal distortion pre-correction model, a preset mismatch filter coefficient, a preset mutual coupling filter coefficient, a linearly processed preset forward signal, linearly processed preset digital feedback signals and the pre-corrected signal;

weighting each of the plurality of signal matrices by using a respective weighting factor to generate the combined matrix, acquiring the nonlinear distortion pre-compensation parameter, a mismatch compensation parameter and a mutual coupling compensation parameter based on the combined matrix.

16. The method for signal distortion pre-correction of claim 15, wherein a signal matrix corresponding to the $j^{th}$ channel in the plurality of channels is:

$$W_j = \begin{bmatrix} x_j(n) \cdot f_{00}^n & x_j(n) \cdot f_{01}^n & \cdots & x_j(n-L) \cdot f_{LQ}^n \\ x_j(n+1) \cdot f_{00}^{n+1} & x_j(n+1) \cdot f_{01}^{n+1} & \cdots & x_j(n+1-L) \cdot f_{LQ}^{n+1} \\ \vdots & \vdots & \ddots & \vdots \\ x_j(n+N) \cdot f_{00}^N & x_j(n+N) \cdot f_{00}^N & \cdots & x_j(n+N-L) \cdot f_{LQ}^N \end{bmatrix},$$

$$V_j = \begin{bmatrix} x_j(n) + z_j(n) - y'_j(n) \\ x_j(n+l) + z_j(n+l) - y'_j(n+1) \\ \vdots \\ x_j(n+N) + z_j(n+N) - y'_j(n+N) \end{bmatrix},$$

wherein $W_j$ is a signal matrix constructed based on signal $x_j(n)$ of the $j^{th}$ channel, $V_j$ is a signal matrix constructed based on signals $x_j(n)$, $y'_j(n)$ and $z_j(n)$ of the $j^{th}$ channel, $$f_{lk}^n = \sum_{p=0}^{k} [h_a * x_j(n-l) + h_b * x_j(n-l)]^p \cdot |x_j(n-l)|^{k-p},$$

which is a nonlinear basis function, $(\cdot)^p$ is a $p^{th}$ power of $(\cdot)$, with p having a range of [0, k], k is an intermediate variable having a range of [0,Q], $x_j$ is the linearly processed forward signal, $z_j$ is the pre-corrected signal, $y'_j$ is the linearly processed digital feedback signal, n and l are data index, $h_a$ is the mismatch filter coefficient, $h_b$ is the mutual coupling filter coefficient, L and Q are memory depth and nonlinear order of the preset signal distortion pre-correction model, respectively, and N+1 is a data length used to construct the plurality of signal matrices.

17. The method for signal distortion pre-correction of claim 15, wherein the correcting the forward signal inputted based on the correction parameter to obtain the pre-corrected signal comprises:

performing rate conversion on the forward signal to obtain a converted forward signal;

correcting the converted forward signal according to the nonlinear distortion pre-compensation parameter in the correction parameter to generate a first corrected signal;

filtering the converted forward signal according to the mismatch filter coefficient in the correction parameter to generate a first intermediate signal;

correcting the first intermediate signal according to the mismatch compensation parameter in the correction parameter to obtain a second corrected signal;

filtering the converted forward signal according to the mutual coupling filter coefficient in the correction parameter to generate a second intermediate signal;

correcting the second intermediate signal according to the mutual coupling compensation parameter in the correction parameter to obtain a third corrected signal;

merging the first corrected signal, and at least one of the second corrected signal and the third corrected signal, to obtain a fourth corrected signal;

processing the fourth corrected signal according to the link imbalance calibration parameter in the correction parameter to generate a fifth corrected signal; and performing rate conversion on the fifth corrected signal to obtain the pre-corrected signal, and outputting the pre-corrected signal.

\* \* \* \* \*